US009835956B2

(12) United States Patent
Liu et al.

(10) Patent No.: US 9,835,956 B2
(45) Date of Patent: Dec. 5, 2017

(54) APPARATUS AND METHOD FOR OVERLAY MEASUREMENT

(71) Applicant: Semiconductor Manufacturing International (Shanghai) Corporation, Shanghai (CN)

(72) Inventors: Yang Liu, Shanghai (CN); Qiang Wu, Shanghai (CN); Liwan Yue, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 15/131,500

(22) Filed: Apr. 18, 2016

(65) Prior Publication Data

US 2016/0313115 A1  Oct. 27, 2016

(30) Foreign Application Priority Data

Apr. 23, 2015  (CN) .......................... 2015 1 0199057

(51) Int. Cl.
  *G01B 11/00* (2006.01)
  *G03F 7/20* (2006.01)
  *G01B 11/27* (2006.01)
  *G03F 9/00* (2006.01)

(52) U.S. Cl.
  CPC ........ *G03F 7/70633* (2013.01); *G01B 11/272* (2013.01); *G03F 9/7088* (2013.01)

(58) Field of Classification Search
  CPC . G03F 9/70; G03F 9/7088; G03F 9/00; G01B 11/272; H01L 21/681
  USPC ........................................................ 356/400
  See application file for complete search history.

(56) References Cited

U.S. PATENT DOCUMENTS

| | | | |
|---|---|---|---|
| 2004/0150824 A1* | 8/2004 | Matsumoto | G03F 9/7046 356/401 |
| 2004/0207853 A1* | 10/2004 | Govorkov | G01J 9/0246 356/450 |
| 2006/0023198 A1* | 2/2006 | Froehlich | G03F 7/70425 355/77 |
| 2011/0032535 A1* | 2/2011 | Liesener | G03F 7/70633 356/511 |
| 2016/0047744 A1* | 2/2016 | Adel | G03F 7/70633 356/401 |
| 2016/0146740 A1* | 5/2016 | Lu | G01B 11/272 356/620 |

\* cited by examiner

*Primary Examiner* — Tarifur Chowdhury
*Assistant Examiner* — Md M Rahman
(74) *Attorney, Agent, or Firm* — Anova Law Group, PLLC

(57) ABSTRACT

The present disclosure provides apparatus and methods for overlay measurement. An exemplary overlay measurement apparatus includes an illuminating unit configured to generate illuminating light to illuminate a first overlay marker formed on a wafer to generate reflected light; and a first measuring unit configured to receive the reflected light from the first overlay marker to cause the reflected light to laterally shift and shear to generate interference light, to receive the interference light to form a first image, and to determine existence of an overlay offset and an exact value of the overlay offset, according to the first image.

17 Claims, 9 Drawing Sheets

APPARATUS AND METHOD FOR OVERLAY MEASUREMENT

CROSS-REFERENCES TO RELATED APPLICATIONS

This application claims the priority of Chinese patent application No. 201510199057.3, filed on Apr. 23, 2015, the entirety of which is incorporated herein by reference.

FIELD OF THE INVENTION

The present invention generally relates to the field of semiconductor manufacturing and, more particularly, relates to overlay measurement apparatus and overlay measurement methods thereof.

BACKGROUND

Photolithography is a major process for the fabrication of integrated circuits (ICs). A photolithography process transfers patterns on a reticle to a photoresist layer formed on a substrate.

The photolithography process is usually performed by a photolithography apparatus. The photolithography apparatus includes a wafer stage for loading a substrate; a reticle stage, disposed above the wafer stage, for loading a reticle; a light source, disposed above the reticle, for providing the exposure light; and an optical projection unit, disposed between the reticle stage and the wafer stage, for projecting light passing through the reticle onto the substrate.

During the exposure process, an overlay measurement is required to determine if the current layer is aligned with the previous layer over the substrate. Such an overlay measurement is able to ensure the alignment between patterns formed on the current layer and patterns formed on the previous layer.

The existing overlay measurements include the image-based overlay (IBO) technology and the diffraction-based overlay (DBO) technology. Because the bright-field detection is easily affected by various defects on a substrate, such as the rough background on the substrate, and the deformation of the overlay marker during a chemical mechanical planarization process, etc., the IBO technology is already unable to meet the overlay measurement requirements for new technical nodes. Thus, the DBO technology is becoming one of the primary means of the overlay measurement.

The DBO technology acquires overlay errors by measuring the asymmetry of the light intensity between the positive and the negative diffraction orders in the angular resolution of the diffracted light from overlay markers. Although the DBO technology is able to determine the existence of overlay offset, i.e., whether there is an offset, during the overlay measurement, it is difficult to obtain the specific value of the overlay offset. The disclosed methods and systems are directed to solve one or more problems set forth above and other problems.

BRIEF SUMMARY OF THE DISCLOSURE

One aspect of the present disclosure includes an overlay measurement apparatus. The overlay measurement apparatus includes an illuminating unit configured to generate illuminating light to illuminate a first overlay marker formed on a wafer to generate reflected light; and a first measuring unit configured to receive the reflected light from the first overlay marker to cause the reflected light to laterally shift and shear to generate interference light, to receive the interference light to form a first image, and to determine existence of an overlay offset and an exact value of the overlay offset according to the first image.

Another aspect of the present disclosure includes an overlay measurement method. The overlay measurement method includes illuminating a first grating of a first overlay marker formed on a wafer to generate first reflected light; forming first lateral shearing interference fringes from a portion of the first reflected light; obtaining a first offset of the first grating relative to a first optical axis according to the first lateral shearing interference fringes; illuminating a second grating of the first overlay marker formed on the wafer to generate second reflected light; forming second lateral shearing interference fringes from a portion of the second reflected light; obtaining a second offset of the second grating relative to the first optical axis according to the second lateral shearing interference fringes; and determining existence of an overlay offset and an exact value of the overlay offset according to a difference between the first offset and the second offset.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
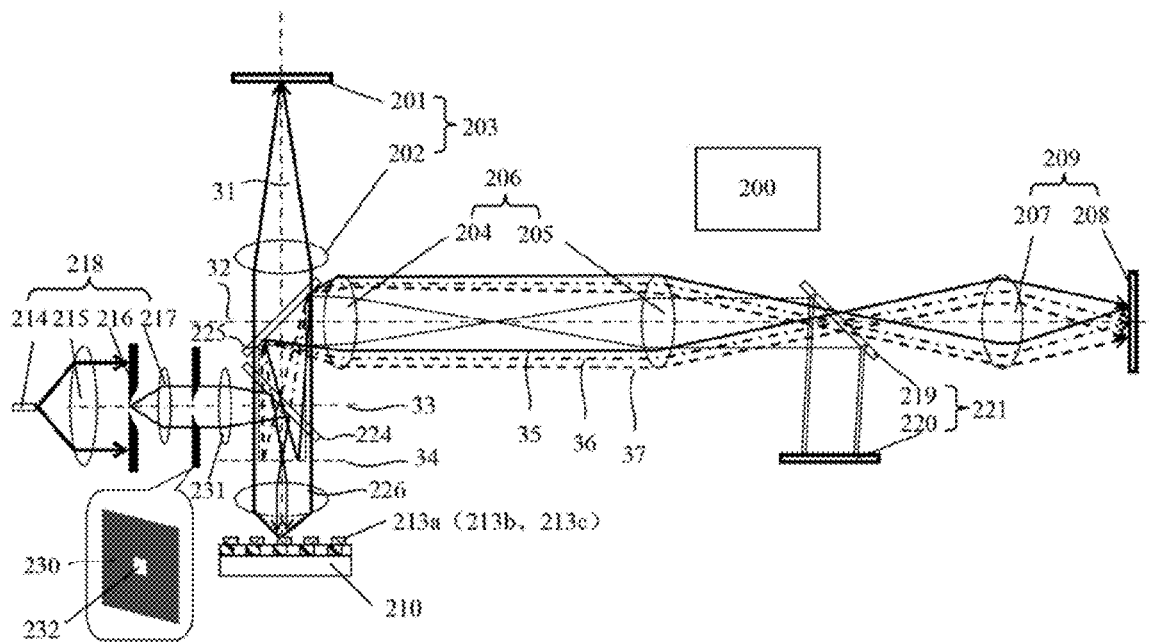
FIGS. 1-2 illustrate an exemplary overlay measurement apparatus according to the disclosed embodiments.
Figure 2:
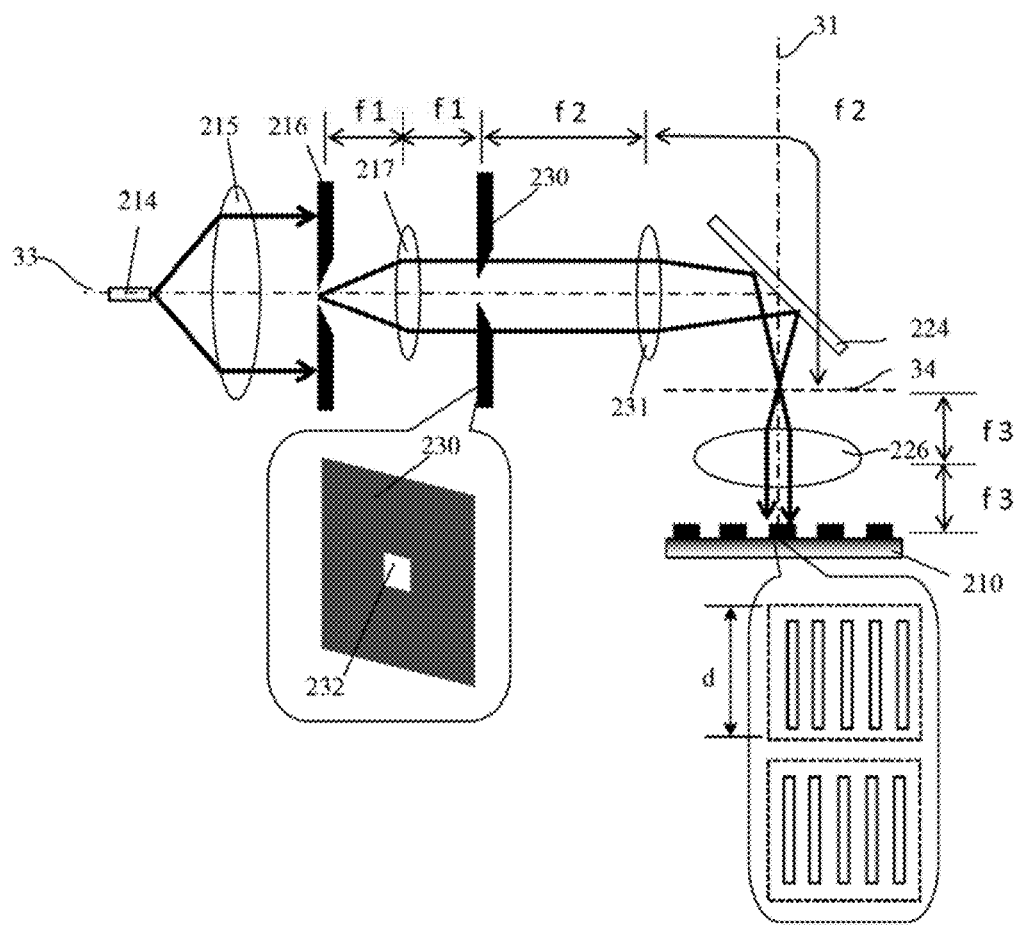
Figure 3:
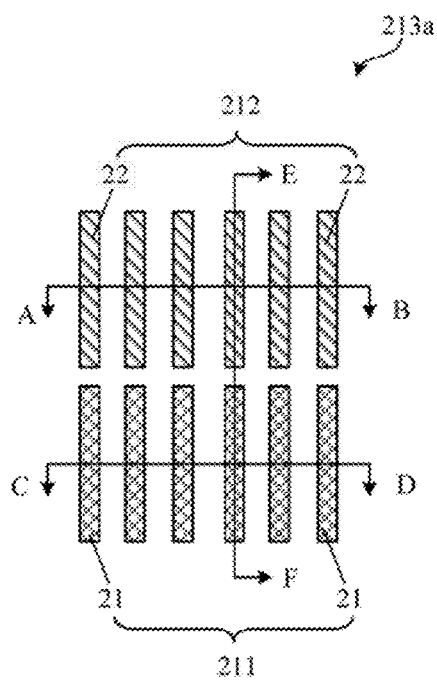
FIGS. 3-10 illustrate exemplary structures of overlay markers consistent with the disclosed embodiments.

FIGS. 1-2 illustrate an exemplary overlay measurement apparatus consistent with the disclosed embodiments. As illustrated in FIG. 1, the overlay measurement apparatus includes a main control unit 200 and an illuminating unit 218.

The main control unit 200 may control the operation of the overlay measurement apparatus including, sending and receiving control signals, data processing, and display of related data, etc. The main control unit 200 may include a computer, and related circuits, etc.

The illuminating unit 218 may generate light to illuminate the first overlay marker 213a, the second overlay marker 213b and/or the third overlay marker 213c formed on a wafer 210. For example, reflected light may be generated when the first overlay marker 213a and the second overlay marker 213b are illuminated. Positive and negative diffracted light may be generated when the third overlay marker 213c is illuminated.

Further, the overlay measurement apparatus also include a first measuring unit 221. The first measuring unit 221 may be configured to receive the reflected light from the first overlay marker 213a. The first measuring unit 221 may also cause the received reflected light to generate lateral shifting and shearing interference to form interference light; and may receive the interference light to form a first image. The existence of an overlay offset may be determined according to the first image. The specific value of the overlay offset may also be obtained.

Further, the overlay measurement apparatus may also include a second measuring unit 203. The second measuring unit 203 may be configured to receive the reflected light generated on the second overlay marker 213b to form a second image. According to the second image, whether there is an overlay offset may be determined.

Further, the overlay measurement apparatus may also include a third measuring unit 209. The third measure unit 209 may be configured to receive the positive and negative diffracted light generated on the third overlay marker 213c to form a third image. According to the third image, whether there is an overlay offset may be determined.

Further, the overlay measurement apparatus may also include a first optical axis 31, a second optical axis 32 and a first imaging lens 226. The second optical axis 32 may be perpendicular to the first axis 31; and may cross with the first optical axis 31.

Further, the overlay measurement apparatus may also include a first beam-splitting plate 224 and a second beam-splitting plate 225. The first beam-splitting plate 224 may be disposed on the first optical axis 31. The first beam-splitting plate 224 may have a first surface and a second surface opposing the first surface. The first imaging lens 226 may be disposed on the first optical axis 31 below the first surface of a first beam-splitting plate 224. The second beam-splitting plate 225 may be disposed at the intersection point of the first optical axis 31 and the second axis 32. The second beam-splitting plate 225 may have a third surface and a fourth surface opposing the third surface. The angle between the first beam-splitting plate 224 and the first optical axis 31 may be approximately 45°; and the angle between the second beam-splitting plate 225 and the extension line of the first beam-splitting plate 224 may be approximately 90°.

Moreover, the first beam-splitting plate 224 may be disposed on the first optical axis 31 at the side of the second beam-splitting plate 225 far away from the second measuring unit 203. The third surface of the second beam-splitting plate 225 may face the second surface of the first beam-splitting plate 224.

The first beam-splitting plate 224 and the second beam-splitting plate 225 may be configured to change the light transmission direction on the optical path. A portion of the light may continue to transmit after passing through the first beam-splitting plate 224 and the second beam-splitting plate 225; and a portion of the light may continue to transmit after being reflected on the first beam-splitting plate 224 and the second beam-splitting plate 225.

The second measuring unit 203 may be disposed on the first optical axis 31 at the side of the fourth surface of the second beam-splitting plate 225. A portion of the reflected light may be received by the second measuring unit 203 after the first beam-splitting plate 224 and the second beam-splitting plate 225.

Further, the second measuring unit 203 may include a second imaging lens 202 and an image-based imaging unit 201. The second imaging lens 202 may be disposed on the first optical axis 31 at the side of the fourth surface of the second beam-splitting plate 225. The image-based imaging unit 201 may be disposed on the first optical axis 31 at the side of the second imaging lens 202 far away from the second beam-splitting plate 225. The second imaging lens 202 may focus the portion of the reflected light passing through the second beam-splitting plate 225 on the image-based imaging unit 201. The image-based imaging unit 201 may then receive the reflected light converged by the second imaging lens 202 to form a second image; and may determine whether there is an overlay offset according to the second image.

During the overlay measurement of the second overlay marker 213b, the image-based imaging unit 201 may receive the reflected light from the second overlay marker 213b to form the second image directly. That is, the real image of the second overlay maker 213b may be formed on the image-based imaging unit 201. The image-based imaging unit 201 may include CMOS, or CCD image sensors, etc.

The third measuring unit 209 may be disposed on the second optical axis 32 at the side of the third surface of the second beam-splitting plate 225. During the overlay measurement, a portion of the positive and negative diffracted light generated by the third overlay marker 213c may be received by the third measuring unit 209 after passing through the first beam-splitting plate 224 and being reflected by the third surface of the second beam-splitting plate 225.

Further, a relay lens unit 206 may be disposed on the second optical axis 32 between the third measuring unit 209 and the second beam-splitting plate 225. The relay lens unit 206 may include a first relay lens 204 and a second relay lens 205. The distance between the first relay lens 204 and the second beam-splitting plate 225 may be shorter than the distance between the second relay lens 205 and the second beam-splitting plate 225. Moreover, the first relay lens 204 and the second relay lens 205 may share a same focus point.

The third measuring unit 209 may include a third imaging lens 207 and a diffraction-based imaging unit 208. The third imaging lens 207 may be disposed on the second optical axis 32 at the side of the relay lens unit 206 far away from the second beam-splitting plate 225. The diffraction-based imaging unit 208 may be disposed on the second optical axis 32 at the side of the third imaging lens 207 far away from the second beam-splitting plate 225. The third imaging lens 207 may converge the positive and negative diffracted light onto the diffraction-based imaging unit 208 after passing through the relay lens unit 206. The diffraction-based imaging unit 208 may receive a portion of the positive and negative diffracted light to form a third image after passing through the third imaging lens 207; and may determine whether there is an overlay offset according to the third image.

The first measuring unit 221 may be disposed between the relay lens unit 206 and the third measuring unit 209. The first measuring unit 221 may include a transparent beam-splitting plate 219 and an interferometer imaging unit 220. The transparent beam-splitting plate 219 may be disposed on the second optical axis 32 between the relay lens unit 206 and the third measuring unit 209. The transparent beam-splitting plate 219 may include a fifth surface and a sixth surface opposing the fifth surface. Moreover, the fifth surface of the transparent beam-splitting plate 219 may face the third surface of the second beam-splitting plate 225. The angle between the transparent beam-splitting plate 219 and the second optical axis 32 may be approximately 45°; and the angle between the transparent beam-splitting plate 219 and the extension line of the second beam-splitting plate 225 may be approximately 90°. The interferometer imaging unit 220 may be disposed below the fifth surface of the transparent beam-splitting plate 219.

A portion of the reflected light (generated on the first overlay marker 213a) may be reflected on the fifth surface and the sixth surface of the transparent beam-splitting plate 219 after passing through the relay lens unit 206. An interference may occur between two sets of reflected light from the fifth surface and the sixth surface respectively; and may be received by the interferometer imaging unit 220 to generate the first image. According to the first image, the existence of an overlay offset may be determined; and the specific value of the overlay offset may also be determined.

The transparent beam-splitting plate 219 may be a transparent beam-splitting plate with a wedged angle. That is, there may be a wedged angle between the fifth surface and the sixth surface of the transparent beam-splitting plate 219. During the overlay measurement, after passing through the second beam-splitting plate 225 and the relay lens unit 206, the light reflected by the overlay marker may be further reflected on the fifth surface and the sixth surface of the transparent beam-splitting plate 219 with the wedged angle. Such a light may be divided into two light waves with an identical amplitude and a space shift. The two light waves may superimpose (or interfere) with each other; and may be received by the interferometer imaging unit 220. In one embodiment, the wedged angle may be in a range of approximately 1°-5°. Specifically, the wedged angle may be approximately 2°.

Further, the overlay measurement apparatus may also include a third optical axis 33. The third optical axis 33 may be intersected perpendicularly with the first optical axis 31. The first beam-splitting plate 224 may be disposed at the intersection point of the first optical axis 31 and the third optical axis 33. The illuminating unit 218 may be disposed on the third optical axis 33 at the side of the first surface of the first beam-splitting plate 224. The illuminating light generated from the illuminating unit 218 may be reflected by the first surface of the first beam-splitting plate 224; and then converged by the first imaging lens 226 to illuminate the first overlay marker 213a, the second overlay marker 213b and/or the third overlay marker 213c.

The illuminating unit 218 may include a light source 214, a beam expander lens 215, a first aperture 216 and a first condensing lens 217 sequentially disposed on the third optical axis 33. The illuminating unit 218 may also be referred to provide a Köhler illumination. The light source 214 may generate a point light source. The beam expander lens 215 may convert the point light source to parallel light. The first aperture 216 may restrict the light beam. The first condensing lens 217 may convert the light passing through the first aperture 216 to parallel light.

The illuminating unit 218 may also include a first driving unit (not shown), a second aperture 230, and a second condensing lens 231. The second aperture 230 may be disposed between the first condensing lens 217 and the first beam-splitting plate 224. The second condensing lens 231 may be disposed between the second aperture 230 and the first beam-splitting plate 224. The second aperture 230 may restrict the size of the light beam passing through the first condensing lens 217. The second condensing lens 231 may converge the light on the first surface of the first beam-splitting plate 224 after passing through the second aperture 230; and then focus the converged light on the back focal plane 34 of the first imaging lens 226. The first driving unit may be connected to the second aperture 230 to drive the second aperture 230 to move along the direction perpendicular to the third optical axis 33. Thus, the incident direction of the light passing through the second aperture 230 may be changed.

In one embodiment, the second aperture 230 may include a shielding layer (not labeled) and a square hole 232 in the shielding layer. After passing through the first condensing lens 217, the light beam may be restricted by the second aperture 230; and continue to transmit only through the square hole 232 of the second aperture 230. The second aperture 230 may be at different locations driven by the first driving unit. Therefore, the location of the incident light on the surface of the second condensing lens 231 after passing through the second aperture 230 may be changed, as well as the incident angle of the light beam on the first surface of the first beam-splitting plate 224 after being converged by the second condensing lens 231. As a result, the light beam may illuminate different regions of the wafer 210 after being reflected by the first surface of the first beam-splitting plate 224.

In one embodiment, the first driving unit may drive the second aperture 230 to move up and down along the direction perpendicular to the third optical axis 33. By moving the second aperture 230, the illuminating light generated by the illuminating unit 218 may sequentially illuminate a first grating and a second grating of the first overlay marker 213a. Thus, the reflected light from the first grating and the second grating may undergo lateral shifting and shearing, and then be sequentially received by the first measuring unit 221. By measuring the intensity of the light after the lateral shifting and shearing interference respectively with the first measuring unit 221, a first offset of the first grating of the first overlay marker relative to the first optical axis 31 may be obtained; and a second offset of the second grating of the first overlay marker 213a relative to the first optical axis 31 may be obtained. The difference between the first offset and the second offset may determine whether there is an overlay offset, and the specific value of the overlay offset. Thus, it may not require the wafer 210 to move during the overlay measurement, the error caused by the movement of the wafer 210 may be minimized; and the accuracy of the overlay measurement may be improved.

In one embodiment, as illustrated in FIG. 2, the first focal length of the first condensing lens 217 may be referred to "f1"; and the second focal length of the second condensing lens 231 may be referred to "f2". The first imaging lens 226 may have a third focal length "f3". The distance between the first aperture 216 and the first condensing lens 217 may be equal to "f1". The distance between the second aperture 230 and the first condensing lens 217 may be equal to "f1"; and the distance between the second aperture 230 and the second condensing lens 231 may be equal to "f2". The sum of the distance between the second condensing lens 231 and the first beam-splitting plate 224 and the distance between the first beam-splitting plate 224 and the back focal plane 34 of the first imaging lens 226 may be equal to "f2". The side length of the first grating or the second grating of the first overlay marker 213a may be equal to "d". For illustrative purposes, the area in the dashed line indicates the area occupied by the first grating or the second grating. In one embodiment, to achieve the separate illumination of the illuminating unit 218 to the first grating and the second grating of the first overlay marker 213a, during the overlay measurement, the side length "L" of the square hole 232 of the second aperture 230 may need to satisfy the following equation:

$$L=(d+n)\times(f2/f3)$$

Where "n" may be in a range of approximately 2 μm-5 μm.

Further, as illustrated in FIG. 1, the overlay measurement apparatus may also include a pupil plane (or a Fourier plane) 34. The pupil plane (or the Fourier plane) 34 may be a virtual plane; and may be disposed between the first beam-splitting plate 224 and the first imaging lens 226; and may correspond to the back focal plane 34 of the first imaging lens 226.

The light reflected by the third overlay marker 213c may be divided to a plurality of diffraction orders on the pupil plane (or the Fourier plane) 34, such as the 0th order, and the +1th order and the −1th order that are symmetrically distributed around the 0th order. The third measuring unit 209 may receive the diffracted light from the +1th order, the 0th order, and −1th order to generate a third image. In one embodiment, for illustrative purposes, as shown in FIG. 1, the dotted line "37" may indicate the +1th order diffracted light; the dotted line "36" may indicate the 0th order diffracted light; and the dotted line "35" may indicate the −1th order diffracted light. In certain other embodiments, the number of diffraction orders may be more than two.

The first overlay marker 213a, the second overlay marker 213b and the third overlay marker 213c may be formed on the wafer 210 at different locations. In a practical application process, one or more of the first overlay marker 213a, the second overlay marker 213b and the third overlay marker 213c may be formed on the wafer 210 as needed. The overlay measurement apparatus may respectively measure the first overlay marker 213a, the second overlay marker 213b and the third overlay marker 213c formed on the wafer 210 to obtain the corresponding overlay accuracy and the corresponding overlay offset. The first overlay marker 213a, the second overlay marker 213b and the third overlay marker 213c may be measured with any appropriate sequence.

In certain other embodiments, the second measuring unit or the third measuring unit may not be integrated in the overlay measurement apparatus. That is, the overlay measurement apparatus may only include the first measuring unit. The overlay measurement apparatus may include an illuminating unit to generate an illuminating light. The first overlay marker formed on the wafer may be illuminated; and the reflected light may then be generated. The first measuring unit may receive the reflected light from the first overlay marker. The received reflected light may undergo lateral shifting and shearing to form interference light. The interference light may be received to form a first image. The first image may be used to determine whether there is an overlay offset, and the specific value of the overlay offset.

Further, the overlay measurement apparatus may also include a first optical axis and a second optical axis. The second optical axis may perpendicularly intersect with the first optical axis.

Further, the overlay measurement apparatus may also include a first beam-splitting plate. The first beam-splitting plate may be disposed on the first optical axis; and may have a first surface and a second surface opposing the first surface.

Further, the overlay measurement apparatus may also include a second beam-splitting plate. The second beam-splitting plate may be disposed at the intersection point of the first optical axis and the second optical axis. The second beam-splitting plate may have a third surface and a fourth surface opposing the third surface. The angle between the first beam-splitting plate and the first optical axis may be approximately 45°. The angle between the second beam-splitting plate and the extension line of the first beam-splitting plate may be approximately 90°. Moreover, the third surface of the second beam-splitting plate may face the second surface of the first beam-splitting plate.

The second optical axis at the side of the third surface of the second beam-splitting plate may also include a relay lens unit. The relay lens unit may include a first relay lens and a second relay lens. The distance between the first relay lens and the second beam-splitting plate may be shorter than the distance between the second relay lens and the second beam-splitting plate. Moreover, the first relay lens and second relay lens may share a same focus point.

The first measuring unit may be disposed on the second optical axis at the side of the relay lens unit far away from the second beam-splitting plate. The first measuring unit may include a transparent beam-splitting plate and an interferometer imaging unit. The transparent beam-splitting plate, disposed on the second optical axis between the relay lens unit and the third measuring unit, may include a fifth surface and a sixth surface opposing the fifth surface. The fifth surface of the transparent beam-splitting plate may face the third surface of the second beam-splitting plate. The angle between the transparent beam-splitting plate and the extension line of the second beam-splitting plate may be approximately 90°. The interferometer imaging unit may be disposed below the fifth surface of the transparent beam-splitting plate.

Further, the overlay measurement apparatus may also include a third optical axis and a first imaging lens. The third optical axis may intersect perpendicularly with the first optical axis. The first beam-splitting plate may be disposed at the intersection point of the first optical axis and the third optical axis. The illuminating unit may be disposed on the third optical axis at the side of the first surface of the first beam-splitting plate. The first imaging lens may be disposed on the first optical axis under the first surface of the first beam-splitting plate. The illuminating light generated from the illuminating unit may be reflected by the first surface of the first beam-splitting plate; and may pass through the first imaging lens to illuminate the overlay marker.

The illuminating unit may include a light source, a beam expander lens, a first aperture and a first condensing lens sequentially disposed on the third optical axis. The light source may generate a point light source. The beam expander lens may convert the point light source to parallel light. The first aperture may restrict the light beam. The first condensing lens may convert the light passing through the first aperture to the parallel light.

The illuminating unit may also include a first driving unit, a second aperture and a second condensing lens. The second aperture may be disposed between the first condensing lens and the first beam-splitting plate. The second condensing lens may be disposed between the second aperture and the first beam-splitting plate. The second aperture may restrict the size of the light beam passing through the first condensing lens. The second condensing lens may converge the light on the first surface of the first beam-splitting plate passing through the second aperture, and then focus on the back focal plane of the first imaging lens. The first driving unit may be connected to the second aperture to drive the second aperture to change the incident direction of the light after passing through the second aperture.

There may be a wedged angle between the fifth surface and the sixth surface of the transparent beam-splitting plate. During the overlay measurement, the first measuring unit may be at a first position. The illuminating unit may first illuminate the first overlay marker. The light may be reflected on the third surface of the second beam-splitting plate after passing through the first imaging lens and the first beam-splitting plate. The light may then be further reflected on the fifth surface and the sixth surface of the transparent beam-splitting plate after passing through the relay lens. The reflected light from the fifth surface and the sixth surface of the transparent beam-splitting plate may undergo lateral shifting and shearing to form an interference light. The interference light may be received to form a first image. The first image may be used to determine whether there is an overlay offset, and the specific value of the overlay offset by the first measuring unit.

Figure 4:
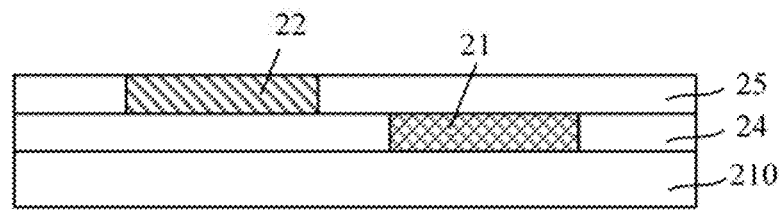
Figure 5:
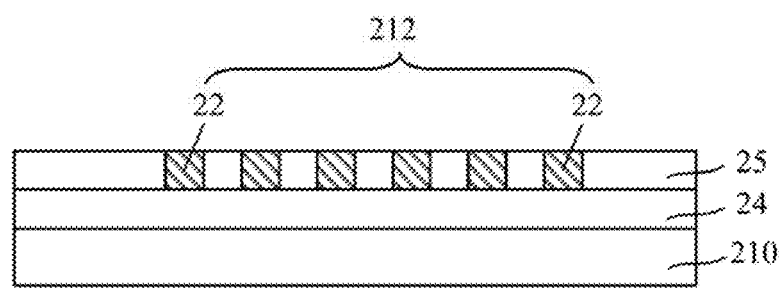
Figure 6:
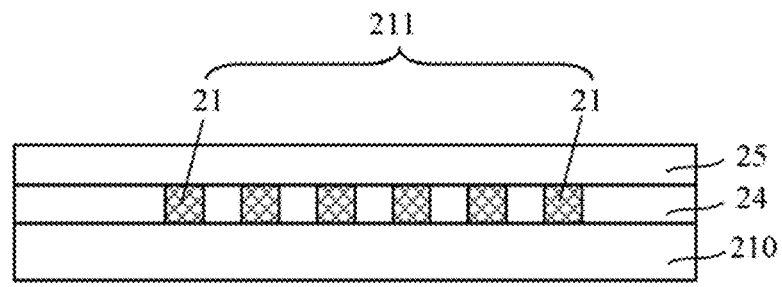

FIGS. 3-6 illustrate an exemplary first overlay marker 213a consistent with the disclosed embodiments. FIG. 4 illustrates a cross-sectional view of the structure illustrated in FIG. 3 along the line "EF"; FIG. 5 illustrates a cross-sectional view of the structure illustrated in FIG. 3 along the line "AB"; and FIG. 6 illustrates a cross-sectional view of the structure illustrated in FIG. 3 along the line "CD".

As shown in FIGS. 3-6, the first overlay marker 213a may be a grating type of overlay marker. In one embodiment, the first overlay marker 213a may include a first grating 212 disposed in the bottom dielectric layer; and a second grating 211 disposed on the top dielectric layer. The second grating 212 may be disposed on the inclined top of the first grating 211.

In one embodiment, the first grating 211 may be disposed in the first dielectric layer 24 formed on the top surface of the wafer 210. The second grating 212 may be disposed in the second dielectric layer 25 formed on the first dielectric layer 24. The second grating 212 may be disposed on the inclined top of the first grating 211.

The first grating 211 may include a plurality of first grating stripes 21. There may be a slit between two adjacent first grating stripes 21. The second grating 212 may include a plurality of second grating stripes 22. There may be a slit between two adjacent second grating stripes 22. In one embodiment, the number and the arrangement direction of the first grating stripes 21 and the second grating stripes 22 may be the same.

In one embodiment, the formation of the first overlay marker 213a may include forming the first dielectric layer 24 on the wafer 210; forming the first grating 211 in the first dielectric layer 24; forming the second dielectric layer 25 to cover the first dielectric layer 24, and the first grating 211; and forming the second grating 212 in the second dielectric layer 25.

During the measurement of the first overlay marker 213a, the wafer 210 with the first overlay marker 213a may be placed on the stage of the overlay measurement apparatus. Then, the overlay measurement apparatus may perform a wafer alignment to establish a relative position between the wafer 210 and the stage.

The first image formed by the first measuring unit 221 may include first transverse shearing interference fringes and second transverse shearing interference fringes. The process to determine whether there is an overlay offset by the first measuring unit 221 may include sequentially illuminating the first grating 211 and the second grating 212 of the first overlay marker 213a to form first reflected light. A portion of the first reflected light generated by the first grating 211 may be received by the interferometer imaging unit 220 of the first measuring unit 221. The received first reflected light may undergo lateral shearing and interference to generate the first transverse shearing interference fringes. Further, a portion of the second reflected light generated by the second grating 212 may be received by the interferometer imaging unit 220 of the first measuring unit 221. The received second reflected light may undergo lateral shearing and interference to generate the second transverse shearing interference fringes.

Then, the first offset and the second offset may be obtained through the first transverse shearing interference fringes and the second transverse shearing interference fringes by the first measuring unit 221, respectively. The difference between the first offset and the second offset may be used to determine whether there is an overly offset, and the specific value of the overlay offset by the first measuring unit 221.

During the overlay measurement, the illuminating unit 218 may sequentially illuminate the first grating 211 and the second grating 212 of the first overlay marker 213a by two methods. In one method, the illuminating unit 218 may illuminate the first grating 211 of the first overlay marker 213a first, followed by illuminating the second grating 212 of the first overlay marker 213a. In another method, the illuminating unit 218 may illuminate the second grating 212 of the first overlay marker 213a first, followed by illuminating the first grating 211 of the first overlay marker 213a.

Figure 14:
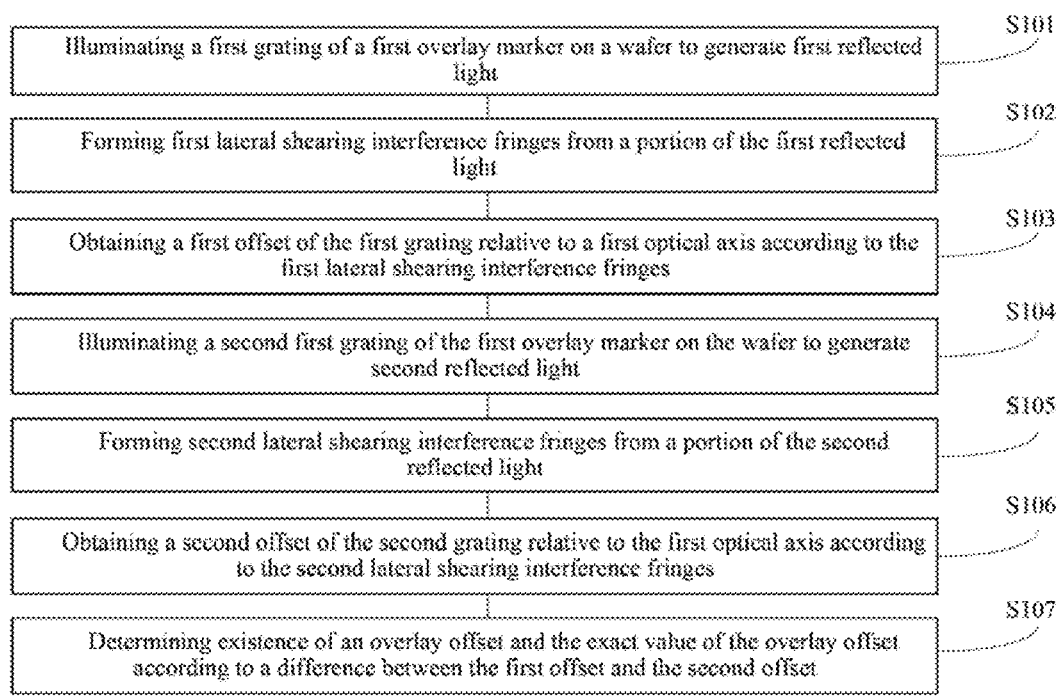
FIG. 14 illustrates an exemplary overlay measurement method consistent with the disclosed embodiments.

Taking illuminating the first grating 211 of the first overlay marker 213a first as an example to explain the process of the overlay measurement, an overlay measurement process is illustrated in FIG. 14. As shown in FIG. 14, the overlay measurement process may include illuminating a first grating of a first overlay marker on a wafer to generate first reflected light (S101); forming first lateral shearing interference fringes from a portion of the first reflected light (S102); obtaining a first offset of the first grating relative to a first optical axis according to the first lateral shearing interference fringes (S103); illuminating a second first grating of the first overlay marker on the wafer to generate second reflected light (S104); forming second lateral shearing interference fringes from a portion of the second reflected light (S105); obtaining a second offset of the second grating relative to the first optical axis according to the second lateral shearing interference fringes (S106); and determining existence of an overlay offset and an exact value of the overlay offset according to a difference between the first offset and the second offset (S107).

Specifically, at the beginning of the overlay measurement process, the illuminating unit 218 may illuminate the first grating 211 of the first overlay marker 213a to generate first reflected light. The first reflected light generated by the first grating 211 may pass through the first imaging lens 226; and become parallel first reflected light. The parallel first reflected light may pass through the first beam-splitting plate 224; and may be reflected on the third surface of the second beam-splitting plate 225. The reflected light may then pass through the relay lens unit 206; and arrive at the transparent beam-splitting plate 219. After being reflected at the fifth surface and the sixth surface of the transparent beam-splitting plate 219, the first transverse shearing interference fringes may be generated. The corresponding first transverse shearing interference fringes may be detected by the diffraction-based imaging unit 208 in the first measuring unit 221; and the first offset of the first grating 211 relative to the first optical axis 31 may be obtained. Then, the second aperture 230 in the illuminating unit 218 may move; and the light from the illuminating unit 218 may illuminate the second grating 212 of the first overlay marker 213a. The second reflected light, generated from the second grating 212, may pass through the first imaging lens 226; and become parallel second reflected light. The parallel second reflected light may pass through the first beam-splitting plate 224; and may be reflected on the third surface of the second beam-splitting plate 225. The reflected light may then pass through the relay lens unit 206; and arrive at the transparent beam-splitting plate 219. After being reflected at the fifth surface and the sixth surface of the transparent beam-splitting plate 219, the second transverse shearing interference fringes may be generated. The corresponding second transverse shearing interference fringes may be detected by the diffraction-based imaging unit 208 in the first measuring unit 221; and the second offset of the second grating 212 relative to the first optical axis 31 may be obtained. The absolute value of the difference between the first offset and the second offset may be used to determine whether there is an overlay offset along the first direction, and the specific value of the overlay offset by the first measuring unit 221.

In one embodiment, when the absolute value of the difference between the first offset and the second offset is equal to, or smaller than approximately 1 nm, the overlay may be determined to be normal. When the absolute value of the difference between the first offset and the second offset is greater than approximately 1 nm, there may be an overlay offset. The absolute value of the difference between the first offset and the second offset may be the value of the overlay offset.

Figure 11:
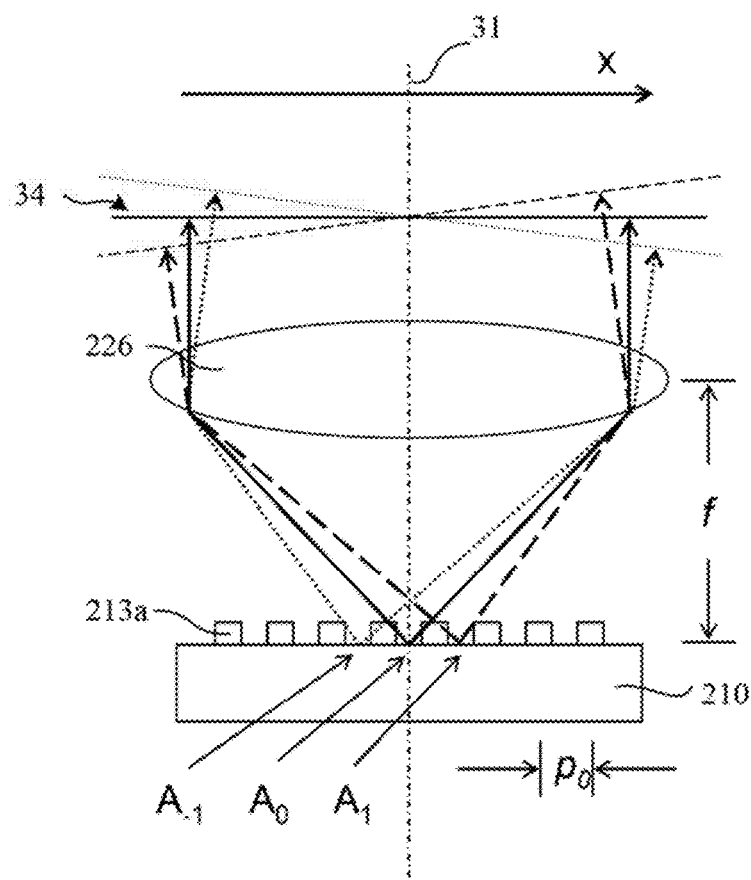
FIGS. 11-13 illustrate certain stages of an overlay measurement process using a first detection unit consistent with the disclosed embodiments.
Figure 12:
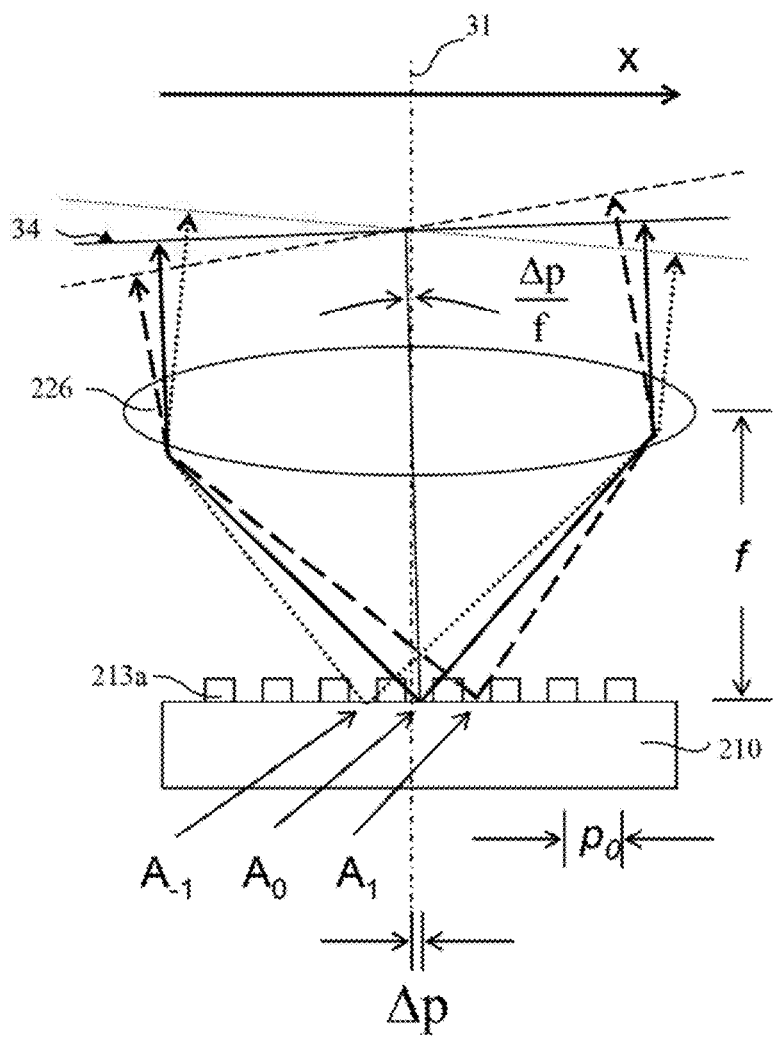
Figure 13:
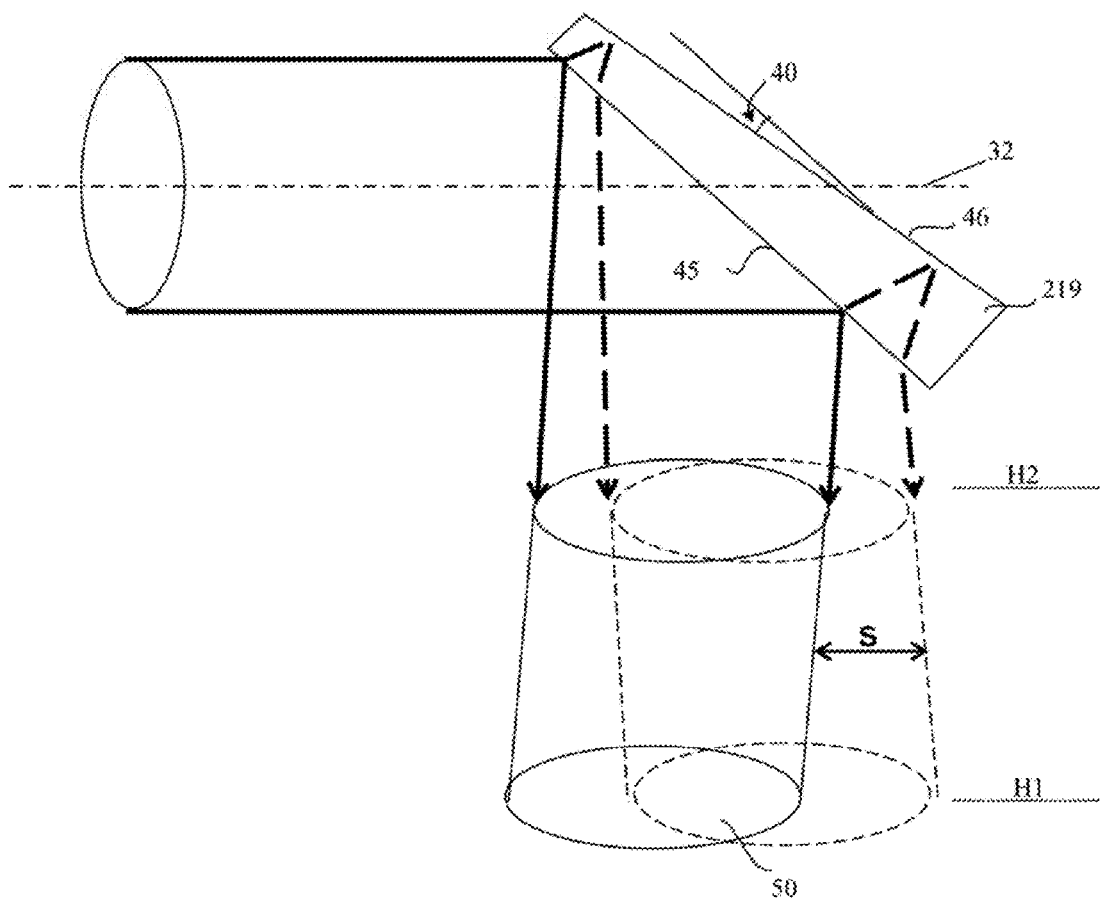

FIGS. 11-13 illustrate an exemplary mechanism to determine whether there is an overlay offset and the value of the overlay offset using the first measuring unit 213a. As illustrated in FIG. 11, after aligning the wafer 210 having the first overlay marker 213a with the overlay measurement apparatus, the horizontal position of the first overlay marker 213a may be disposed on the focal plane of the first imaging lens 226. If there is no offset for the first overlay marker 213a relative to the first optical axis 31 (e.g. when the first optical axis 31 is intersected perpendicularly to the central axis of the first grating 211 or the second grating 212 of the first overlay marker 213a), the illuminating unit 218 (referring to FIG. 1) may illuminate the first overlay marker 213a. The light from the gratings of the first overlay marker 213a (including the first grating 211 or the second grating 212) may be converged after passing through the first imaging lens 226; and may become parallel light on the back focal plane 34 (the pupil plane or the Fourier plane) of the first imaging lens 226. The light from the slit on the first optical axis 31 (such as the slit $A_0$ in FIG. 11) may become parallel light in parallel to the first optical axis 31 on the back focal plane of the first imaging lens 226. The light from the slits away from the first optical axis 31 (such as the slit $A_{-1}$ and the slit $A_1$ in FIG. 11) may become the parallel light with a certain tilted angle on the back focal plane of the first imaging lens 226. The tilted angle=$p_0/f$, where $p_0$ is the grating period (e.g., a center-to-center distance between adjacent grating stripes) of the first grating 211 or the second grating 212; and f is the focal length of the first imaging lens 226, as shown in FIG. 11.

In one embodiment, for illustrative purposes, the light from the slit $A_0$, the slit $A_{-1}$ and the slit $A_1$ may be used as an example to explain the mechanism for determining the overlay offset. When there is no offset, based on the Geometrical Optics, the amplitudes of the light from the slits may be $A_0$, $A_{-1}$ and $A_1$; and be presented as in equations (1)-(3):

$$A_0 = a_0 \tag{1}$$

$$A_{-1} = a_0 \cdot e^{-i\left(\frac{2\pi x}{\lambda f} p_0\right)} \tag{2}$$

$$A_1 = a_0 \cdot e^{i\left(\frac{2\pi x}{\lambda f} p_0\right)} \tag{3}$$

Wherein $a_0$ is a constant; f is the focal length of the first imaging lens 226; $\lambda$ is the wavelength of the illuminating light; $p_0$ is the grating period of the first grating or the second grating (or the grating period of the third grating or the fourth grating); and x is the location of the light intensity or phase on the back focal plane 34 (the pupil plane or the Fourier plane).

If there is a certain offset ($\Delta p$) for the gratings (the first grating 211, or the second grating 212) of the first overlay marker 213a relative to the first optical axis 31, as illustrated in FIG. 12, based on the Geometrical Optics, all the light beams on the back focal plane of the first imaging lens 226 may have a rotation $\Delta p/f$. Under such a condition, the amplitudes of the light from the slit $A_0$, the slit $A_{-1}$ and the slit $A_1$ may be $A_0$, $A_{-1}$ and $A_1$, respectively, and may presented as in equations (4)-(6):

$$A_0 = a_0 \cdot e^{i\left(\frac{2\pi x}{\lambda f} \Delta p\right)} \tag{4}$$

$$A_{-1} = a_0 \cdot e^{-i\left(\frac{2\pi x}{\lambda f}(p_0 - \Delta p)\right)} \tag{5}$$

$$A_1 = a_0 \cdot e^{i\left(\frac{2\pi x}{\lambda f}(p_0 + \Delta p)\right)} \tag{6}$$

Such equations only illustrate the calculation for the amplitudes of the light from the three exemplary slits $A_0$, $A_{-1}$ and $A_1$, equations for more slits may be referred to equations (7)-(8):

$$A_{-n} = a_0 \cdot e^{-i\left(\frac{2\pi x}{\lambda f}(np_0 - \Delta p)\right)} \tag{7}$$

$$A_n = a_0 \cdot e^{i\left(\frac{2\pi x}{\lambda f}(np_0 + \Delta p)\right)} \tag{8}$$

Where n is the nth slit in the first grating 211 or the second grating 212; and n is greater than 1.

The distribution of the amplitudes of the light from all the slits of the first grating 211 or the second grating 212 on the back focal plane (the pupil plane or the Fourier plane) of the first imaging lens 226 is shown in equation (9):

$$A = A_0 + \sum_{n=1}^{N}(A_{-n} + A_n) = a_0 e^{i\left(\frac{2\pi x}{\lambda f}\Delta p\right)} \cdot \left[1 + \sum_{n=1}^{N} 2\cos\left(\frac{2\pi x}{\lambda f} np_0\right)\right] \tag{9}$$

Where N is the maximum number of slits on both sides of the asymmetrical axis of the first grating 2111 or the second grating 212. For example, when N=5, the total number of slits=2N+1=11.

As illustrated in FIG. 13, in one embodiment, the first measuring unit 221 may include a transparent beam-splitting plate 219. The transparent beam-splitting plate 219 may include the fifth surface 45 and the sixth surface 46 opposing the fifth surface 45. There may be a wedged angle 40 between the fifth surface 45 and the sixth surface 46. In one embodiment, the wedged angle 40 may be in a range of approximately 1°-5°. During the overlay measurement using the first measuring unit 221, the reflected light from the first overlay marker 213a may pass through the second beam-splitting plate 225 (referring to FIG. 1) and the relay lens 206 (referring to FIG. 1); and may be reflected on the fifth surface 45 and the sixth surface 46 of the transparent beam-splitting plate 219 with the wedged angle. The light may then be separated into two light waves with the same amplitude and with a shift of some distance "s" in the space. After a superposition (or interference), the two light waves may form an intersection region 50. The intersection region 50 may correspond to the first transverse shearing interference fringes or the second transverse shearing interference fringes. The light intensity of the intersection region 50 may be determined by the interferometer imaging unit 220 (referring to FIG. 1) by detecting the corresponding first transverse shearing interference fringes or the corresponding second transverse shearing interference fringes.

After passing through the structure illustrated in FIG. 13, the amplitude of light after lateral shifting and shearing interference (the shearing displacement is s) may be obtained from equation (10):

$$A_{composit}(s) = A(s) + A(s=0) = \frac{1}{2}\left\{b_0 e^{i\left(\frac{2\pi(x+s)}{\lambda f}\Delta p\right)} \cdot \left[1 + \sum_{n=1}^{N} 2\cos\left(\frac{2\pi(x+s)}{\lambda f}np_0\right)\right] + b_0 e^{i\left(\frac{2\pi x}{\lambda f}\Delta p\right)} \cdot \left[1 + \sum_{n=1}^{N} 2\cos\left(\frac{2\pi x}{\lambda f}np_0\right)\right]\right\} \quad (10)$$

Where $b_0$ is a constant; and s is the shearing displacement.

To simplify the illustration, in one embodiment, a special location $$\left(x = \frac{\lambda f}{p_0}\right)$$

of a slit on the back focal plane may be used as the observation point for the light intensity to obtain the light intensity distribution (I). The light intensity distribution may be as shown in equation (11):

$$I(s) = A^*_{composite}(s) \cdot A_{composite}(s) = b_0^2\left\{\frac{1}{4}\left[1 + \sum_{n=1}^{N}\cos\left(\frac{2\pi s}{\lambda f}np_0\right)\right]^2 + \left(N + \frac{1}{2}\right)^2 + \left(N + \frac{1}{2}\right)\cdot\left[1 + \sum_{n=1}^{N}\cos\left(\frac{2\pi s}{\lambda f}np_0\right)\right]\cdot\cos\left(\frac{2\pi s}{\lambda f}\Delta p\right)\right\} \quad (11)$$

According to Equation (11), in one embodiment, the relationships among the overlay offset and the light intensity after the transverse shearing, the number of slits in the first overlay marker and the period, the wavelength of the illuminating light, the focal length of the first imaging lens, and the amount of shearing may be established based on the transverse shear mechanism. Because the slit number N, the wavelength of the illuminating light λ, the focal length of the first imaging lens f, the period $p_0$ of the first grating or the second grating, and the amount of shearing may be known, with the measurement of the light intensity (I) of the corresponding first transverse shearing interference fringes, or the corresponding second transverse shearing interference fringes in the intersection region 50 (through the interferometer imaging unit 220), the first measuring unit 221 may calculate the value of the offset Δp, including the first offset of the first grating 211 of the first overlay marker 213a relative to the first optical axis 31, and the second offset of the second grating 212 of the first overlay marker 213a to the first optical axis 31. The absolute value of the difference between the first offset and the second offset may be used to determine whether there is an overlay offset and the specific value of the overlay offset by the first measuring unit 221. In certain other embodiments, other locations on the back focal plane may be used as the observation point for the light intensity.

Further, as illustrated in FIG. 13, in certain other embodiments, to improve the measurement accuracy, the measuring height of the interferometer imaging unit may be adjusted to obtain the light intensity corresponding to different shearing value. The corresponding first offset, or the corresponding second offset may be obtained according to equation (11). For example, to determine the first offset of the first grating of the first overlay marker 213a relative to the first optical axis 31, the interferometer imaging unit 220 of the first measuring unit 221 (as shown in FIG. 1) may be first disposed at a first measuring height H1 with a corresponding shearing value as $s_1$. The light intensity $I_1$ corresponding to the first transverse shearing interference fringes may be obtained from the interferometer imaging unit 220 at the first measuring height H1. Then, the interferometer imaging unit 220 may be driven by a second driving unit to a second measuring height H2 different from the first measuring height H1. The corresponding shearing value may be $s_2$. The light intensity $I_2$ corresponding to the first transverse shearing interference fringes may be obtained from the interferometer imaging unit 220 at the second measuring height H2. By inserting $s_1$ and $I_1$, or $s_2$ and $I_2$, the first offset may be obtained according to equation (11). Accordingly, the second offset may also be obtained in the similar way.

To illustrate the relatively high precision of the present overlay measurement apparatus, equation (11) may be simplified to equation (12) if there is only one slit:

$$I(s) = A^*_{composite}(s) \cdot A_{composite}(s) = \frac{1}{2}b_0^2\left\{1 + \cos\left(\frac{2\pi s}{\lambda f}\Delta p\right)\right\} \quad (12)$$

When the first imaging lens 226 is a regular objective lens of a microscope, in one embodiment, the focal length f of the imaging lens 226, f=2 mm; the numerical aperture (NA) =0.8; and the width of the back focal plane is 2f×tan (sin$^{-1}$ NA)=2×2 mm×tan(sin$^{-1}$ 0.8)=5.3 mm. If the maximum variable range of the shearing value s is one half of the width of the back focal plane, i.e., 2.65 mm; and the light is green light with a wavelength of 500 nm, the change of argument of Cosine function is:

$$\frac{2\pi s}{\lambda f}\Delta p = \frac{6.28 \times 2.65 \text{ mm}}{500 \text{ nm} \times 2 \text{ mm}}\Delta p = 0.0166 \text{ }\Delta p/\text{nm} \quad (13)$$

In equation (13), if the offset (or the overlay offset) Δp=1 nm, the change of argument is 0.0166. According to Equation (12), the relative change of the light intensity with background deduction is 0.00014. A conventional cooling CCD image sensor may reach 16 bits per pixel dynamic range, i.e., 0-50000, a relative change of 0.00014 may be equivalent to 7/50000. Due to the random fluctuation, the worst fluctuation of the dynamic range of 50000 may be $(50000)^{0.5}$, i.e., 223/50000. Because the detection method is not an imaging method, a plurality of pixels may be multiplied. If 10000 pixels are used, the random fluctuation of the dynamic range may be reduced to 2.23/50000. Such a random fluctuation may be able to match the requirements for seven quanta detection. The sensitivity of the system may be further improved by averaging multiple exposures.

Further, referring to FIG. 1, in one embodiment, the structure of the second overlay marker 213b may be identical to the structure of the first overlay marker 213a. During the overlay measurement, the process to determine whether there is an overlay offset by the second measuring unit 203 may include the following exemplary steps.

The illuminating unit 218 may illuminate the second overlay marker 213b on the wafer 210; and the reflected light may be generated on the second overlay marker 213b. The reflected light may form parallel light after passing through the first imaging lens 226. The reflected light may then pass through the first beam-splitting plate 224 and the second beam-splitting plate 225; and may be received by the image-based imaging unit 201 to generate a second image after being focused by the second imaging lens 202 of the second measuring unit 203. The second image may be the real image of the first grating and the second grating, i.e., first grating real image and second grating real image. Whether there is an overlay offset may be determined by checking the difference between the central position of the first grating real image and the central position the corresponding second grating real image by the second measuring unit 203. The determination criteria may be set according to the practical process. In one embodiment, when the difference of the central positions of the first grating real image and the corresponding second grating real image is greater than approximately 1 nm, there may be an overlay offset. If the difference is equal to or smaller than approximately 1 nm, the overlay may be determined as normal.

Figure 7:
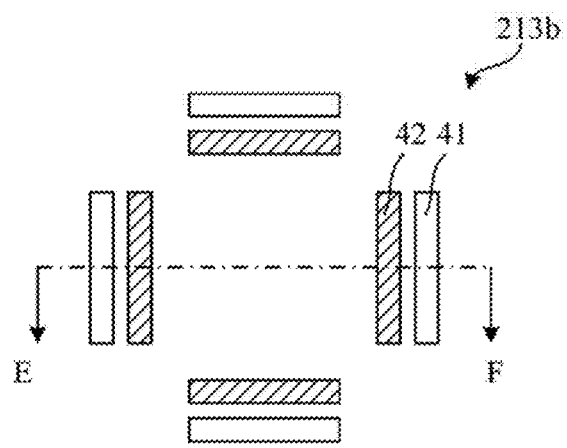
Figure 8:
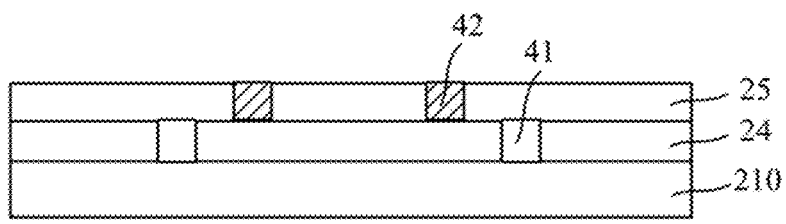

In certain other embodiments, the structure of the second overlay marker 231b may be different from that of the first overlay marker 213a. The detailed structures are illustrated in FIGS. 7-8. FIG. 8 is the cross-sectional view of the structure illustrated in FIG. 7 along the line "EF". The second overlay marker 213b may include the first pattern 41 disposed in the bottom dielectric layer; and the second pattern 42 disposed in the top dielectric layer. The top dielectric layer may be formed on the surface of the bottom dielectric layer, and the first pattern 41 may be disposed outside of the second pattern 42 (or the projection of the second pattern 42 in the bottom dielectric layer).

In one embodiment, the second overlay marker 213b may include the first pattern 41 disposed in the first dielectric layer 24, and the second pattern 42 disposed in the second dielectric layer 25. The second dielectric layer 25 may be formed on top of the first dielectric layer 24. The first pattern 41 may include four first sub-patterns distributed in a shape of square. The second pattern 42 may include four second sub-patterns distributed in a shape of square. Each of the first sub-patterns may be disposed outside of the corresponding second sub-pattern.

Figure 9:
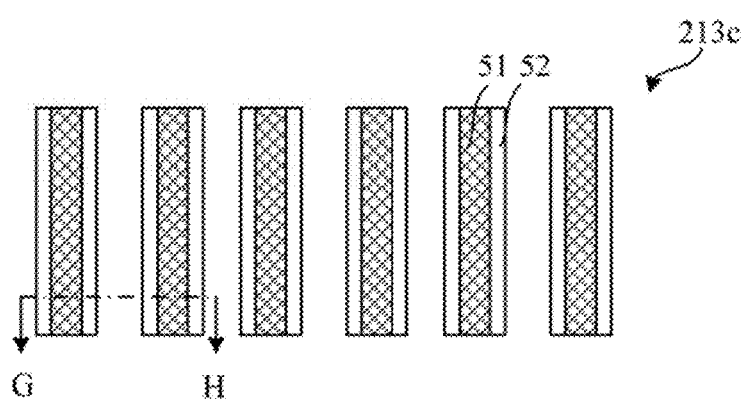
Figure 10:
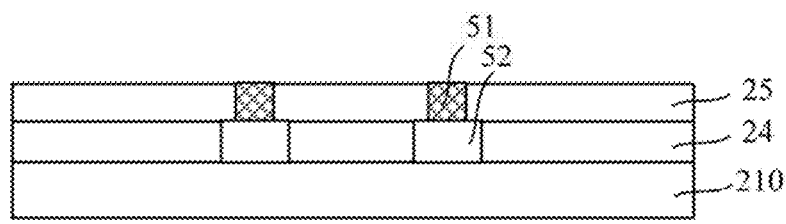

The detailed structure of the third overlay marker 213c is illustrated in FIGS. 9-10. FIG. 10 is the cross-sectional view of the structure illustrated in FIG. 9 along the line "GH".

As shown in FIGS. 9-10, the third overlay marker 213c may include a third grating 52 disposed in the bottom dielectric layer 24, and a fourth grating 51 disposed in the top dielectric layer 25. The top dielectric layer 25 may be formed on the surface of the bottom dielectric layer 24; and the fourth grating 51 may be formed right on top of the third grating 52. The third grating 52 may include a plurality of grating fringes disposed in parallel. The fourth grating 51 may include a plurality of grating fringes disposed in parallel. Each fourth grating fringe may be disposed right on the top of the corresponding third grating fringe. The width of the fourth grating fringes may be smaller than that of the third grating fringes.

During the overlay measurement of the third overlay marker 213c illustrated in FIG. 9, the illuminating unit 218 may illuminate the third overlay marker 213c to generate diffracted light. The generated diffracted light may be received by the third measuring unit 209 to form a third image. If there is a position offset for the third grating 52 and the fourth grating 51 of the third overlay marker 213c (the central position of the third grating 52 does not match the center position of the fourth grating 51), the light intensity between the positive and the negative diffraction orders of the positive and the negative diffracted light generated from the third overlay marker 213c may be different. Such a difference may be used to determine whether there is an overlay offset by the third measuring unit 209. If there is a difference, there may be an overlay offset. If there is no difference, there may be no overlay offset.

Thus, according to the disclosed embodiments, the present disclosed overlay measurement apparatus may include a first measuring unit. The reflected light from the first overlay marker may be received by the first measuring unit to generate a lateral shearing interference to form the interference light. The first measuring unit may also receive the interference light to form a first image; determine the existence of the overlay offset; and obtain the specific value of the overlay offset. Based on the theory of the transverse shearing, the relationships among the overlay offset and the light intensity after transverse shearing, the number of slits in the first overlay marker, the grating period, the wavelength of the illuminating light, the focal length of the first imaging lens, and the shearing value may be established by the overlay measurement apparatus. Since the number of slits, the grating period, the wavelength of the illuminating light, the focal length of the first imaging lens and the shearing value may be known for the first overlay marker, during the overlay measurement, the overlay offset may be obtained if the light intensity after transverse shearing could be obtained. Thus, whether there is an overlay offset and the specific value of the overlay offset may be precisely determined.

Further, the present disclosed overlay measurement apparatus may also include the second measuring unit and the third measuring unit. The overlay markers of different types may be measured. That is, the IBO method and DBO method may be combined in the overlay measurement apparatus. Therefore, the application field of the overlay measurement apparatus may be increased.

Further, the first overlay marker may include the first grating disposed on the bottom dielectric layer; and the second grating disposed on the top dielectric layer. The top dielectric layer may be located on the surface of the bottom dielectric layer; and the second grating may be located on the inclined top of the first grating. By measuring the intensity of the corresponding light with the first measuring unit, the first offset of the first grating relative to the first optical axis may be obtained, as well as the second offset of the second grating relative to the first optical axis. The absolute value of the difference between the first offset and the second offset may be used to determine whether there is an overlay offset, and the specific value of the overlay offset by the first measuring unit.

Further, the third overlay marker may include the third grating disposed in the bottom dielectric layer and the fourth grating disposed in the top dielectric layer. The top dielectric layer may be formed on the surface of the bottom dielectric layer, and the fourth grating may be disposed right on the top of the third grating. The third grating may include a plurality of third grating fringes disposed in parallel. The fourth grating may include a plurality of fourth grating fringes disposed in parallel. Each fourth grating fringe may be disposed right on top of the corresponding third grating fringe; and the width of the fourth grating fringe may be smaller than that of the third grating fringe. During the overlay measurement process, the illuminating unit may illuminate the third overlay marker with the third grating and the fourth grating to generate positive and negative diffracted light. The positive and the negative diffracted light generated from the third overlay marker may be received by the third measuring unit. Thus, whether there is an offset may be determined by comparing the light intensity between the positive and the negative diffracted light.

Further, the illuminating unit may also include the first driving unit, the second aperture and the second condensing lens. The second aperture may be disposed between the first condensing lens and the first beam-splitting plate. The second aperture may restrict the size of the light beam after passing through the first condensing lens. The second condensing lens may converge the light after passing through the second aperture on the first surface of the first beam-splitting plate; and then focus it on the back focal plane of the first imaging lens. The first driving unit may be connected to the second aperture to drive the second aperture to move along a direction perpendicular to the third optical axis. Therefore, the incident direction of the light after passing through the second aperture may be changed. The illuminating unit, the first aperture, the beam expander lens, the first condensing lens and the second condensing lens may be immovable, and the second aperture may move up and down along the direction parallel to the first optical axis driven by the first driving unit. During the measurement of the first overlay marker or the third overlay marker, with the movement of the second aperture, the illuminating unit may illuminate the first grating and the second grating of the first overlay marker and the third overlay marker sequentially without moving the wafer. Therefore, the errors due to the movement of the wafer may be minimized; and the accuracy of the overlay measurement may be improved.

Further, the first measuring unit may also include the second driving unit. The second driving unit may be connected to the interferometer imaging unit to drive the interferometer to be away from or close to the fifth surface of the transparent beam-splitting plate. During the overlay measurement, the interferometer imaging unit may be at different measuring heights to obtain the light intensities corresponding to different measuring heights. With relatively simple calculation, the first offset of the first grating of the first overlay marker relative to the first optical axis and the second offset of the second grating relative to the first optical axis may be determined. Accordingly, the overlay offset may be determined.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. An overlay measurement apparatus, comprising:
   an illuminating unit, configured to generate an illuminating light to illuminate a first overlay marker formed on a wafer to generate reflected light; and
   a first measuring unit, configured to receive the reflected light from the first overlay marker to cause the reflected light to laterally shift and shear to generate interference light, to receive the interference light to form a first image, and to determine existence of an overlay offset and an exact value of the overlay offset, according to the first image;
   a second measuring unit configured to receive reflected light formed from a second overlay marker formed on the wafer to form a second image, and to determine existence of overlay offset according to the second image;
   a third measuring unit configured to receive positive and negative diffracted light formed from a third overlay marker formed on the wafer to form a third image, and to determine existence of overlay offset according to the third image;
   a first optical axis;
   a second optical axis perpendicular to the first optical axis;
   a first imaging lens;
   a first beam-splitting plate having a first surface and a second surface and disposed on the first optical axis; and
   a second beam-splitting plate having a third face and a fourth face and disposed on an intersection point of the first optical axis and the second optical axis,
   wherein:
     an angle between the first optical axis and the first beam-splitting plate is approximately 45°;
     an angle between the second beam-splitting plate and an extension line of the first beam-splitting plate is approximately 90°; and
     the third surface of the second beam-splitting plate faces the second surface of the first beam-splitting plate.

2. The overlay measurement apparatus according to claim 1, wherein:
   the second measuring unit is disposed on the first optical axis at a side of the fourth surface of the second beam-splitting plate; and
   a portion of the reflected light is received by the second measuring unit after passing through the first beam-splitting plate and the second beam-splitting plate.

3. The overlay measurement apparatus according to claim 2, wherein:
   the first overlay marker is a grating type of overlay marker having a first grating formed in a bottom dielectric layer and a second grating formed in a top dielectric layer,
   wherein:
     the bottom dielectric layer is formed on a top surface of the wafer;

the top dielectric layer is formed on the bottom dielectric layer; and the second grating is formed on an inclined top of the first grating.

4. The overlay measurement apparatus according to claim 3, wherein:

the first grating includes a plurality of parallel first grating stripes;

the second grating includes a plurality of parallel second grating stripes; and a distribution of the plurality of first grating stripes is identical to a distribution of the plurality of second grating stripes.

5. The overlay measurement apparatus according to claim 4, wherein:

a structure of the second overlay marker is different from a structure of the first overlay marker; and a structure of the third overlay marker is different from the structure of the first overlay marker.

6. The overlay measurement apparatus according to claim 4, wherein:

a structure of the second overlay marker is identical to a structure of the first overlay marker; and the second image formed by the second measuring unit is a real image of the first grating and a real image of the second grating.

7. The overlay measurement apparatus according to claim 2, wherein:

the third overlay marker includes a third grating formed in a bottom dielectric layer and a fourth grating formed in a top dielectric layer, wherein:

the bottom dielectric layer is formed on a surface of the wafer;

the top dielectric layer is formed on the bottom dielectric layer;

the third grating includes a plurality of third grating stripes;

the fourth grating includes a plurality of fourth grating stripes;

each of the plurality of fourth grating stripes is formed right on a corresponding third grating stripes; and a width of the fourth grating stripe is smaller than a width of the third grating stripe.

8. The overlay measurement apparatus according to claim 1, wherein the second imaging unit further comprising:

a second imaging lens; and an image-based imaging unit wherein:

the second imaging lens is disposed on the first optical axis at a side of the fourth surface of the second beam-splitting plate;

the image-based imaging unit is disposed on the first optical axis at a side of the second imaging lens far away from the second beam-splitting plate; and the second imaging lens converges a portion of the reflected light passing through the second beam-splitting plate on the image-based imaging unit to form the second image and determine existence of an overly offset.

9. The overlay measurement apparatus according to claim 1, wherein:

the third measuring unit is disposed on the third optical axis at a side of the third surface of the second beam-splitting; and a portion of the positive and negative diffracted light is received by the third measuring unit after passing through the first beam-splitting plate and being reflected by the third surface of the second beam-splitting plate.

10. The overlay measurement apparatus according to claim 9, further comprising:

a relay lens unit disposed on the second optical axis between the third measuring unit and the second beam-splitting plate, wherein:

the relay lens unit comprises a first relay lens and a second relay lens;

a distance between the first relay lens and the second beam-splitting plate is smaller than a distance between the second relay lens and the second beam-splitting plate; and the first relay lens and the second relay lens share a same focus point.

11. The overlay measurement apparatus according to claim 10, wherein the third measuring unit comprises:

a third imaging lens; and a diffraction-based imaging unit, wherein:

the third imaging lens is disposed on the second optical axis at a side of the relay lens unit far away from the second beam-splitting plate;

the diffraction-based imaging unit is disposed on the second optical axis at a side of the third imaging lens far away from the second beam-splitting plate;

the third imaging lens converges positive and negative diffracted light passing through the relay lens unit on the diffraction-based imaging unit; and the diffraction-based imaging unit receives a portion of the positive and negative diffracted light converged by the third imaging lens to form the third image, and determine existence of an overlay offset according to the third image.

12. The overlay measurement apparatus according to claim 11, wherein:

the first measuring unit is disposed between the first relay lens and the third measuring unit;

the first measuring unit includes a transparent beam-splitting plate and an interferometer imaging unit;

the transparent beam-splitting plate is disposed on the second optical axis between the relay lens unit and the third measuring unit;

the transparent beam splitting unit includes a fifth surface and a sixth surface;

the fifth surface of the second beam-splitting plate faces the third surface of the second beam-splitting plate;

an angle between the transparent beam-splitting plate and an extension line of the second beam-splitting plate is approximately 90°; and the interferometer imaging unit is disposed under the fifth surface of the transparent beam-splitting plate.

13. The overlay measurement apparatus according to claim 12, wherein:

the fifth surface of the transparent beam-splitting plate and the sixth surface of the transparent beam-splitting plate have a wedged angle.

14. An overlay measurement method, comprising:

illuminating a first grating of a first overlay marker formed on a wafer to generate a first reflected light;

reflecting the first reflected light and forming first lateral shearing interference fringes from a portion of the first reflected light;

obtaining a first offset of the first grating relative to a first optical axis according to the first lateral shearing interference fringes;

illuminating a second grating of the first overlay marker formed on the wafer to generate second reflected light;

forming second lateral shearing interference fringes from a portion of the second reflected light;

obtaining a second offset of the second grating relative to the first optical axis according to the second lateral shearing interference fringes; and determining existence of an overlay offset and an exact value of the overlay offset according to a difference between the first offset and the second offset.

15. The overlay measurement method according to claim 14, wherein:

the first lateral shearing interference fringes and the second interference fringes form a first image obtained by a first measuring unit.

16. The overlay measurement method according to claim 14, further comprising:

measuring a difference between a center position of a first grating real image of a second image formed by a second measuring unit and a center position of a second grating real image of the second image to determine existence of an overlay offset.

17. The overlay measurement method according to claim 14, wherein further comprising:

illuminating a third overlay marker having a third grating and a fourth grating to generate positive and negative diffracted light; and determining existence of an overlay offset according to an intensity difference between negative and positive diffracted light.

* * * * *